United States Patent
Tonouchi (10) Patent No.: US 8,193,898 B2
(45) Date of Patent: Jun. 5, 2012

(54) LAMINATED BODY AND MANUFACTURING METHOD THEREOF

(75) Inventor: Isao Tonouchi, Nagano (JP)

(73) Assignee: Koa Kabushiki Kaisha, Nagano (JP)

( * ) Notice: Subject to any disclaimer, the term of this patent is extended or adjusted under 35 U.S.C. 154(b) by 291 days.

(21) Appl. No.: 12/529,700

(22) PCT Filed: Feb. 28, 2008

(86) PCT No.: PCT/JP2008/053479
§ 371 (c)(1),
(2), (4) Date: Sep. 2, 2009

(87) PCT Pub. No.: WO2008/108258
PCT Pub. Date: Sep. 12, 2008

(65) Prior Publication Data
US 2010/0097172 A1    Apr. 22, 2010

(30) Foreign Application Priority Data
Mar. 2, 2007   (JP) .................................. 2007-052567

(51) Int. Cl.
*H01C 7/18*   (2006.01)
(52) U.S. Cl. ........ 338/204; 338/328; 338/333; 338/254; 338/312
(58) Field of Classification Search ............... 338/328, 338/330, 333, 254, 312, 314, 204
See application file for complete search history.

(56) References Cited

U.S. PATENT DOCUMENTS

| | | | | |
|---|---|---|---|---|
| 6,236,302 B1 * | 5/2001 | Barrett et al. | ............... | 338/22 R |
| 6,677,849 B1 | 1/2004 | Kato et al. | | |
| 6,809,626 B2 * | 10/2004 | Chu et al. | ....................... | 337/167 |
| 6,873,244 B2 * | 3/2005 | Huang et al. | ............... | 338/22 R |
| 7,026,583 B2 * | 4/2006 | Tu et al. | ........................ | 219/541 |

FOREIGN PATENT DOCUMENTS

| | | |
|---|---|---|
| JP | 01-290283 A | 11/1989 |
| JP | 06-077660 A | 3/1994 |
| JP | 06-096914 A | 4/1994 |
| JP | 07-201539 A | 8/1995 |
| JP | 09-298365 A | 11/1997 |
| JP | 10-163004 A | 6/1998 |
| JP | 2003-203806 A | 7/2003 |
| JP | 2004-356306 A | 12/2004 |
| JP | 2006-121005 A | 5/2006 |

* cited by examiner

Primary Examiner — Kyung Lee
(74) Attorney, Agent, or Firm — Smith Patent Office (57) ABSTRACT

A laminated body and fabrication method thereof, which allow space saving and control of variation in internal layer resistance, are provided. When forming an internal-layer resistive element 7 in a multilayer ceramic substrate 10, the internal-layer resistive element 7 is connected to exterior electrodes (an upper surface electrode 32 and an undersurface electrode 34) via multiple via-electrodes 3a and 3b arranged in parallel, without a pad electrode adopted in the conventional laminated body. Moreover, in a multilayer ceramic substrate having multiple internal-layer resistive elements arranged in a multilayer structure, multiple internal-layer resistive elements are directly connected via multiple via-electrodes arranged in parallel.

4 Claims, 6 Drawing Sheets

LAMINATED BODY AND MANUFACTURING METHOD THEREOF

TECHNICAL FIELD

The present invention relates to a laminated body, such as a multilayer ceramic substrate having internal resistors, for example, and a method for manufacturing the same.

BACKGROUND ART

A chip resistor mounted on small electronic equipment etc. has pad electrodes facing each other on an insulating substrate and a resistive element bridging between those pad electrodes. In such a resistor, when the resistive element is connected to an exterior electrode via a pad electrode, the area of the pad electrode is added to the area of the resistive element in a laminated body. Therefore, for example, a circuit board having a structure in which a resistive element is formed directly above a via-hole without preparing such an electrode, directly connecting it to the electric conductor in the via-hole has been proposed in Japanese Patent Application Laid-Open No. 6-77660.

Since in a conventional chip resistor including a resistive element (resistive layer), a resistance film exposed from the edge face of a laminated insulator has a small area, there is a problem with stability of adhesion of the edge face of the resistance film to an exterior electrode and lack of reliability of the same. In view of this problem, technology of increasing the exposure area of a resistance film is disclosed in Japanese Patent Application Laid-Open No. 7-201539.

In the case of the ceramic circuit board disclosed in Japanese Patent Application Laid-Open No. 6-77660 as described above, electrodes are made unnecessary so as to allow implementation of a highly dense circuit on a circuit board or miniaturization of the circuit board. However, separately, a terminal for resistance measurement and corresponding inner layer pattern are additionally required. There is thus such a problem that high density integration is limited. Moreover, since such a conventional ceramic circuit board needs correction of resistance by laser trimming, a substrate structure in which a resistive element is formed on the top surface of the substrate is employed. There is a problem that such a structure is inapplicable to a ceramic circuit board having a multilayer resistor structure in which resistive elements are arranged between layers.

On the other hand, according to the chip resistor disclosed in Japanese Patent Application Laid-Open No. 7-201539, connection state between a resistive element and exterior electrodes, that is, connectivity between a resistance film and an electric conductor section depends upon the cross sectional area of a resistance film, which appears on the edge face of an insulator. Moreover, there is a limit in increase of the area of the resistance film because of its properties. As a result, manufacturing of a chip resistor that secures perfect connectivity with an exterior electrode requires advanced manufacturing technology.

The present invention is provided in light of the problems mentioned above, and aims to provide a laminated ceramic body, which allows space saving and controls variation in internal layer resistances, and a manufacturing method thereof.

DISCLOSURE OF INVENTION

In order to attain the aforementioned purpose, the present invention provides a laminated body made from multiple laminated green sheets. The laminated body is characterized in that it includes an internal-layer resistive element formed inside of the laminated body, an exterior electrode arranged on an external end surface of the laminated body, and a first via-electrode, which allows the internal-layer resistive element to be electrically connected to the exterior electrode, wherein the first via-electrode is constituted by multiple via-electrodes arranged in parallel on one end of the internal-layer resistive element. The laminated body according to the present invention is also characterized in that it further includes a second via-electrode, which allows conduction of multiple internal-layer resistive elements arranged in different layers; wherein the second via-electrode is constituted by multiple via-electrodes arranged in parallel at the ends of the multiple internal-layer resistive elements.

Another aspect of the present invention is characterized in that the exterior electrode is arranged on the top surface and the undersurface of the laminated body in a lamination direction, and the multiple via-electrodes include at least two via-electrodes, which are arranged in parallel and electrically connect one end of the internal-layer resistive element to the exterior electrode arranged on the top surface, and at least two via-electrodes, which are arranged in parallel and electrically connect the other end of the internal-layer resistive element to the exterior electrode arranged on the undersurface.

Yet another aspect of the present invention is characterized in that: the exterior electrode is arranged on the top surface and the undersurface of the laminated body in the lamination direction; the plurality of via-electrodes, which constitute the first via-electrode, comprise at least two via-electrodes arranged in parallel and electrically connect one end of the internal-layer resistive element to the exterior electrode arranged on said top surface, and at least two via-electrodes arranged in parallel and electrically connect the other end of the internal-layer resistive element to the exterior electrode arranged on said undersurface, and the plurality of via-electrodes, which constitute the second via-electrode, comprise at least two via-electrodes arranged in parallel and electrically connect ends of the opposing surfaces of the plurality of internal-layer resistive elements, and provide electrical connection between one ends of the opposing surfaces and between the other ends of the opposing surfaces alternately in the lamination direction, according to the lamination structure of the plurality of internal-layer resistive elements.

According to the present invention with such a structure described above, highly dense assembly and miniaturization (space saving) of a laminated body (multilayer substrate) are possible, and smaller variation in resistance of an internal-layer resistive element may be provided. Moreover, a ceramic laminated body with improved connectivity of internal resistive elements and exterior electrodes may be provided.

BEST MODE FOR CARRYING OUT THE PRESENT INVENTION

First Embodiment

Figure 1A:
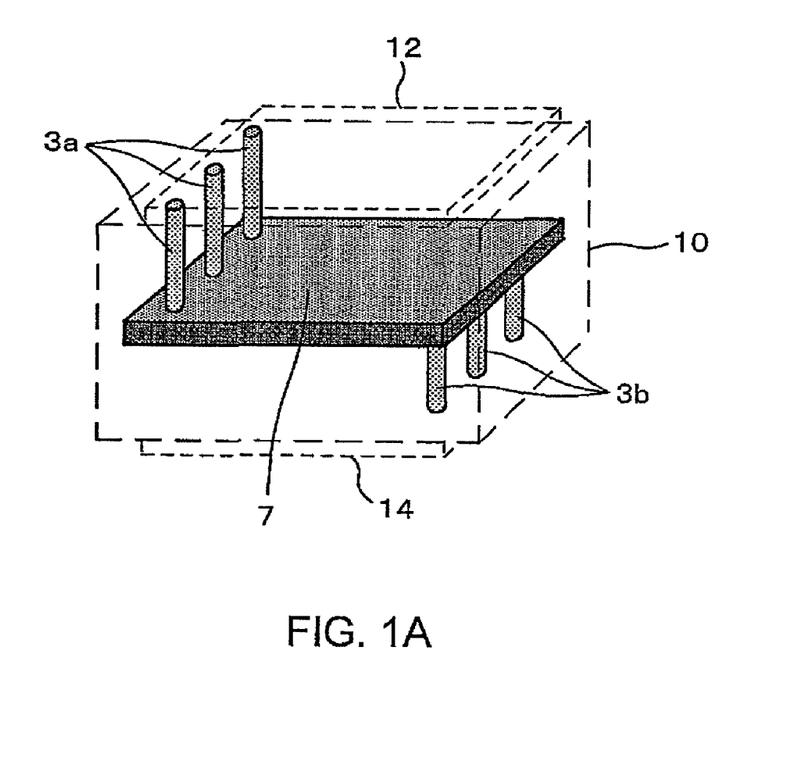
FIGS. 1A and 1B are illustrations showing a structure of a multilayer ceramic substrate according to a first embodiment of the present invention.
Figure 1B:
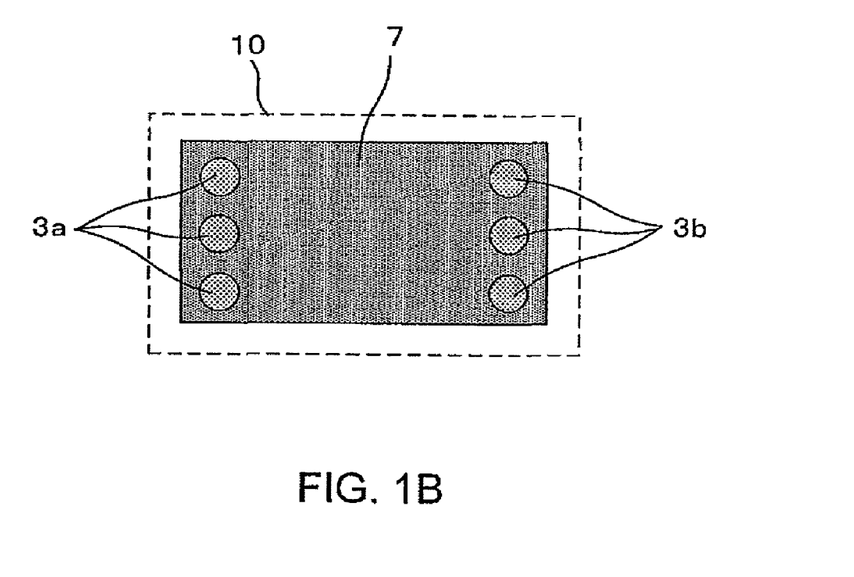

Embodiments according to the present invention are described in detail with reference to attached drawings. FIG. 1A and FIG. 1B are illustrations of a structure of a multilayer ceramic substrate, which is a laminated body, according to a first embodiment of the present invention. FIG. 1A is a perspective outline, and FIG. 1B schematically illustrates an internal structure of the multilayer ceramic substrate when seen from above. Here, although multilayer ceramic substrate types are not limited in particular, they are applicable to, for example, a multilayered circuit board etc. of low temperature co-fired ceramics (LTCC), which is a multilayer ceramic interconnection board with a multilayered circuit pattern in a resistor substrate.

As shown in FIGS. 1A and 1B, with a multilayer ceramic substrate 10 according to the first embodiment, a resistive element 7 is arranged in a predetermined layer of the multiple layers comprising the substrate. Multiple via-electrodes 3a (three electrodes in this case) are arranged in parallel near an end of the top surface of this resistive element 7, so as to connect an upper electrode 12, which is an exterior electrode, to the resistive element 7 while multiple via-electrodes 3b are arranged in parallel near the other end of the undersurface of the resistive element 7, so as to secure connection of a lower electrode 14 and the resistive element 7. Note that each of the via-electrodes 3a and 3b in the multilayer ceramic substrate according to this embodiment may be constituted by at least two electrodes, so as to improve defective conduction due to defective via filling.

Figure 2:
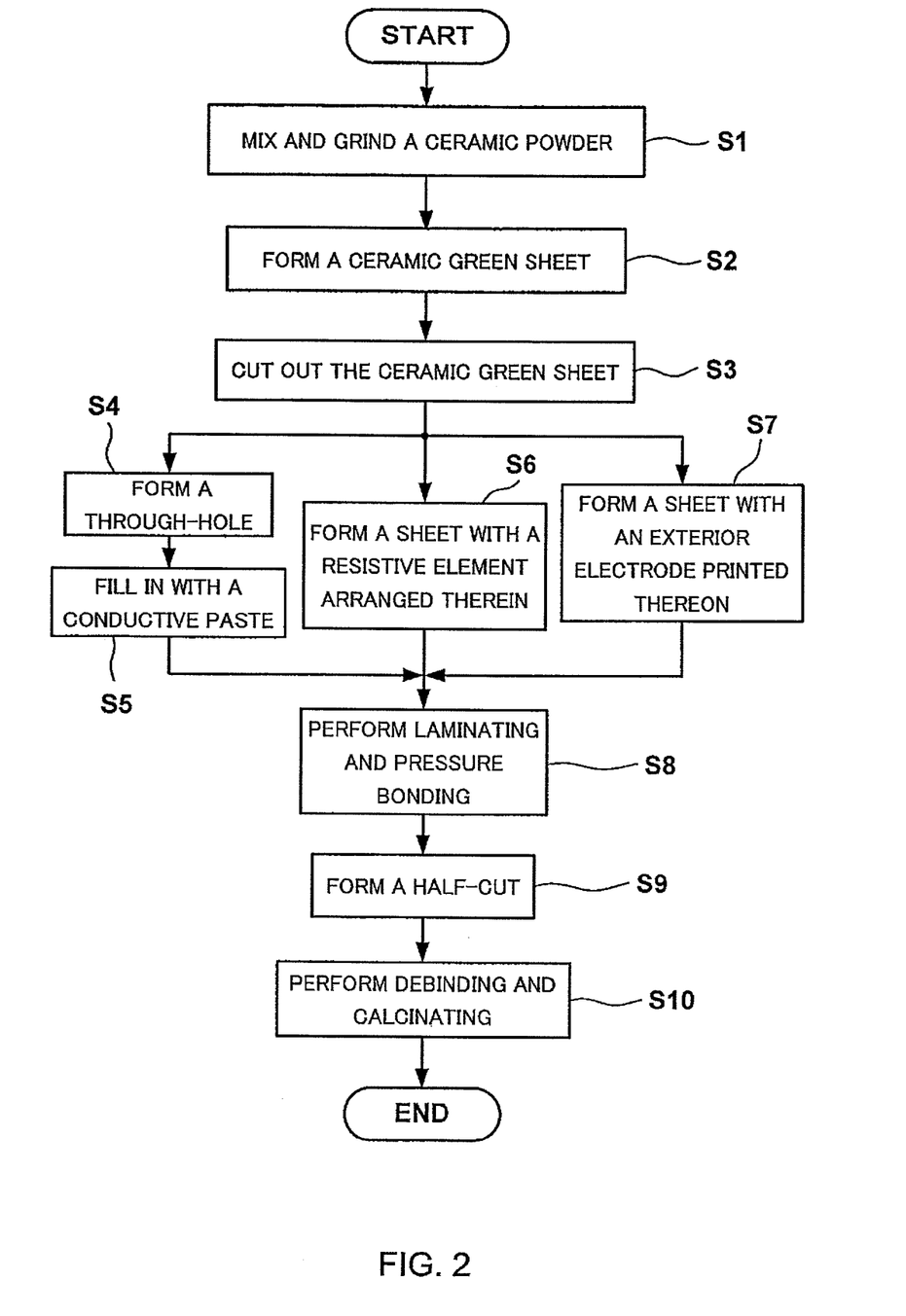
FIG. 2 is a flow chart of a manufacturing process of the multilayer ceramic substrate according to the first embodiment of the present invention.

A manufacturing process for the multilayer ceramic substrate according to the first embodiment is described forthwith. FIG. 2 is a flow chart of the manufacturing process of the multilayer ceramic substrate according to the first embodiment. In Step S1 of FIG. 2, a ceramic powder is mixed and ground.

More specifically, a powdered glass, such as a bolosilicate glass, an alumina ($Al_2O_3$) powder and a typical organic vehicle containing a binding agent, a plasticizer, a solvent etc. are mixed, ground, degassed, and thereafter a ceramic green sheet with a specified thickness is manufactured using a method, such as the doctor blade (ceramic green tape fabrication). Note that, for example, a mixed solvent of methyl ethyl ketone and acetone, and polyvinyl butyral resin are used for the above-mentioned organic vehicle.

In Step S3, the ceramic green sheet manufactured in the process mentioned above is cut down to a predetermined size, and a specific sheet is manufactured through each of the following processes. That is, in Step S4, a sheet is manufactured with a through-hole formed using, for example a punch die or a punching machine. Afterward in Step S5, the through hole formed in Step S4 described above is filled with a conductive paste of silver (Ag) etc., which is a conductive material. This electric conductive paste has a composition in which silver content is 85 to 90 percent by weight, silver granules are 3 to 5 micrometers in diameter, and 10 to 15 percent by weight of organic vehicle is contained, for example.

In Step S6, a sheet including a resistive element is formed. Here, a resistive paste made of a ruthenium oxide material, for example, is printed using a predetermined printing pattern. This resistive paste is made with a triple roll mill by dispersing, for example, a ruthenium oxide as a conductive material and glass made from $SiO_2$, $Al_2O_3$, BaO, and CaO into a vehicle made from ethyl cellulose and terpineol. Moreover, it is preferable to use an oxide glass, which does not allow excessive sintering of the ceramics around the resistive element or impeding of sintering, as the glass component of the resistive paste. As such glass, for example, borosilicate barium glass, borosilicate calcium glass, borosilicate barium calcium glass, borosilicate zinc glass, zinc borate glass etc. can be used.

In Step S7, a sheet on which exterior electrodes are printed is manufactured. More specifically, the sheet on which aforementioned upper surface electrodes and underside electrodes are formed is manufactured by screen printing and calcinating a paste of Ag, Ag—Pd etc. on the sheet. Note that these processes of Steps S4 and S5, Step S6, and Step S7 may be carried out either in parallel or serially. In the latter case, execution order thereof is not limited in particular.

In Step S8, respective green sheets, in each of which a pattern is printed, resistive elements are formed, and exterior electrodes are printed as mentioned above, are laminated in a given order. A laminated ceramic green block is then formed by pressure bonding at a pressure of 30 Mpa and a temperature of 90° C. through uniaxial pressing, isostatic pressing etc., for example. Afterwards in Step S9, a half-cut is formed along a cutting line of the block, and in Step S10, debinding and calcinating are performed at a temperature ranging from 800° C. to 900° C., for example.

Figure 3:
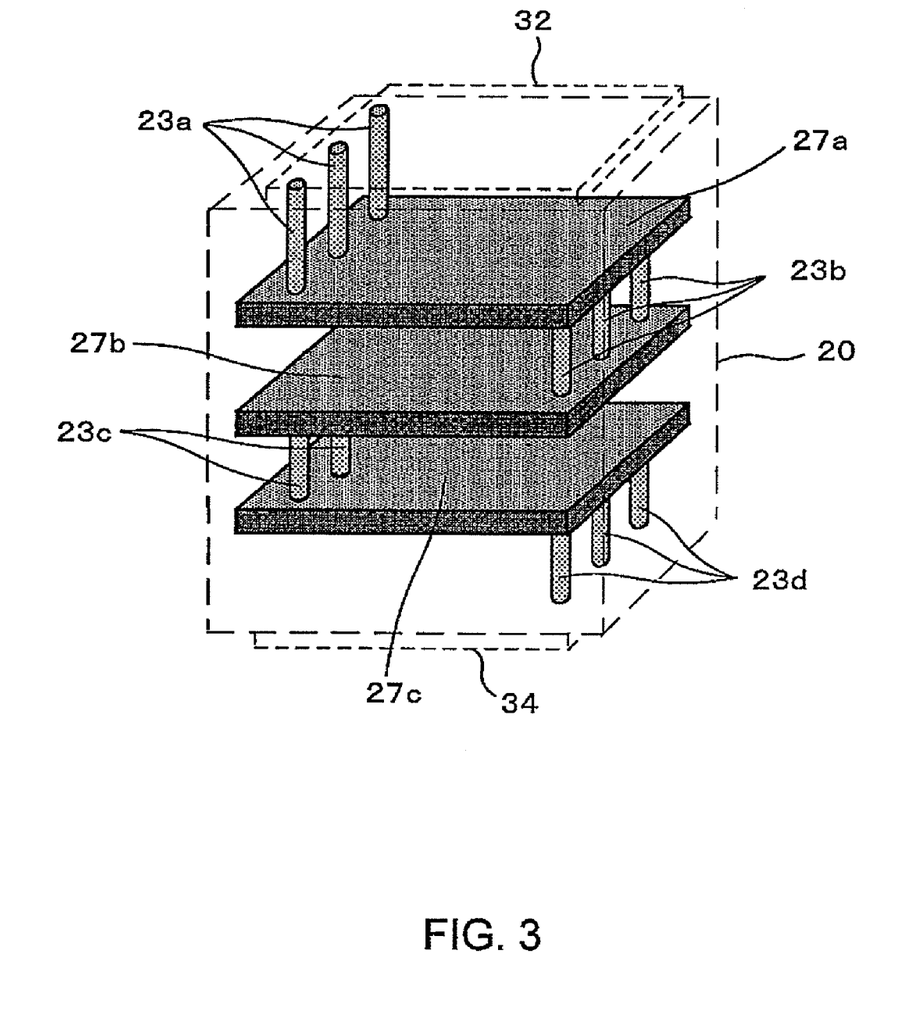
FIG. 3 is a perspective outline of the multilayer ceramic substrate, which has resistive elements with a multilayer structure, according to the first embodiment of the present invention.

FIG. 3 is a perspective outline of a multilayer ceramic substrate having resistive elements arranged in a multilayer structure, according to the first embodiment of the present invention. The multilayer ceramic substrate shown in FIG. 3 has a structure made by arranging resistive elements, which are formed in the multilayer ceramic substrate shown in FIG. 1A and FIG. 1B, in a yet more multilayered structure (in this case, three layers). Therefore, in the multilayer ceramic substrate 20 shown in FIG. 3, resistive elements 27a, 27b, and 27c are arranged in each of three predetermined layers. In order to connect the resistive element 27a and the upper electrode 32, which is an exterior electrode, three via-electrodes 23a are arranged in parallel near one end of the top surface of the resistive element 27a located in the upper layer. Moreover, in order to connect the lower electrode 34 and the resistive element 27c, three via-electrodes 23d are arranged in parallel near one end of the underside of the resistive element 27c on the lower layer side.

Furthermore, in order to connect the resistive element 27b located in the middle layer to each of the resistive elements 27a and 27c arranged above and below the resistive element 27b, three via-electrodes 23b are arranged in parallel between the resistive elements 27a and 27b, and three via-electrodes 23c are arranged in parallel between the resistive elements 27b and 27c. More specifically, the via-electrodes 23b are arranged in parallel between the undersurface of the opposite side end to the end in which the via electrodes 23a of the resistive element 27a are arranged and the upper surface end of the resistive element 27b while the via-electrodes 23c are arranged in parallel between the undersurface of the opposite side end to the end in which the via-electrodes 23b of the resistive element 27b are arranged and the upper surface end of the resistive element 27c. Via-electrodes 23d are arranged in parallel on the undersurface of the opposite side end to the end in which the via-electrodes 23c are arranged.

Such an arrangement in which via-electrodes are arranged in parallel alternately on the upper surface or the undersurface near the end of each of multiple resistive elements arranged in a multilayered structure, and the multiple resistive elements are arranged in a row extends multiple resistive elements in the lamination direction, lengthening dimension L of the resistive elements substantially. As a result, without lengthening the multilayer ceramic substrate (laminated body) more than necessary, the electric strength of the multilayer ceramic substrate can be improved as will be described later.

Figure 7:
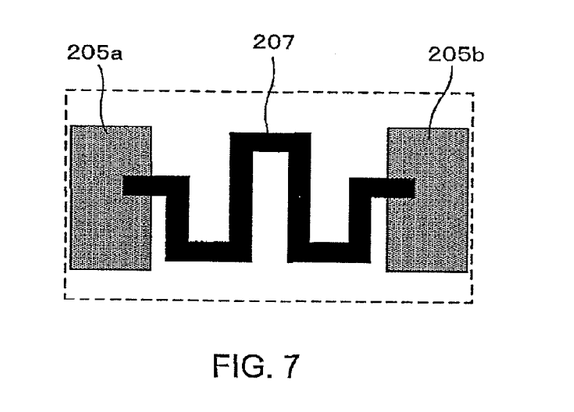
FIG. 7 is an illustration of a constructional example of a conventional chip resistor.

On the other hand, with the conventional chip resistor, electric strength is improved by lengthening dimension L of a resistive element 207 between pad electrodes 205a and 205b and thereby making the voltage per unit length smaller as shown in FIG. 7, for example. In addition, in order to improve defective conduction due to defective via filling, number of each of the via-electrodes 23a, 23b, 23c, and 23d in the ceramic multilayer substrate 20 shown in FIG. 3 is set to at least two.

Therefore, space saving and cost cutting for such a multilayer ceramic substrate having a multilayer structure of two or more layers is possible by directly connecting an internal-layer resistive element and exterior electrodes via multiple via-electrodes arranged in parallel without pad electrodes for forming an internal-layer resistive element in a substrate. Meanwhile, the same for a multilayer substrate having multiple internal-layer resistive elements arranged is also possible by directly connecting internal-layer resistive elements via multiple via-electrodes arranged in parallel. Moreover, precision in resistance of the resistive elements may be improved because there are no pad electrodes in layers.

Namely, while resistance of the conventional chip resistor varies due to poor printing accuracy of resistive elements and/or pad electrodes, the multilayer ceramic substrate according to this embodiment of the present invention has a structure that multiple via-electrodes arranged in parallel are directly connected to an internal-layer resistive element, and thus there is an advantage that precision of the resistance of a resistive element may be improved regardless of printing accuracy. Moreover, when a resistive element is formed in an internal layer, resistance adjustment with laser etc. is impossible. Therefore, by improving precision of resistance through directly connecting multiple via-electrodes arranged in parallel to the internal-layer resistive element, such a disadvantage may be offset.

Note that while the case where the number of the internal-layer resistive elements on the multilayer ceramic substrate according to the aforementioned embodiment is one or three has been explained, the present invention is not limited to that number, and it may be a 2-layer structure, a 4-layer structure, or a multilayer structure with a larger number of layers.

Figure 4A:
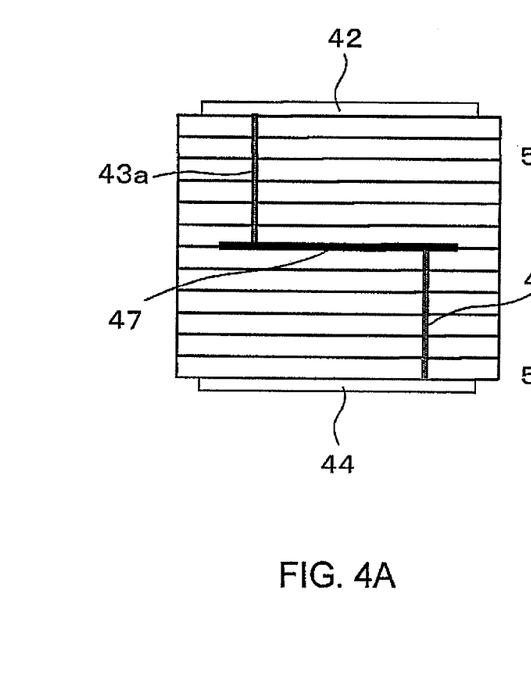
FIGS. 4A, 4B, and 4C are sectional drawings showing examples of three different layered structures of a multilayer ceramic substrate according to the first embodiment.
Figure 4B:
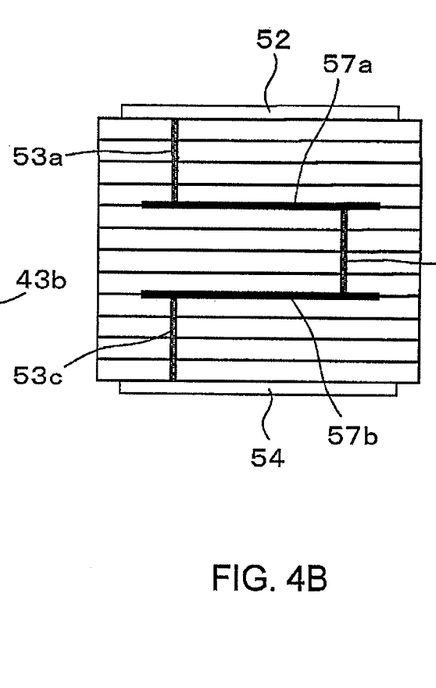
Figure 4C:
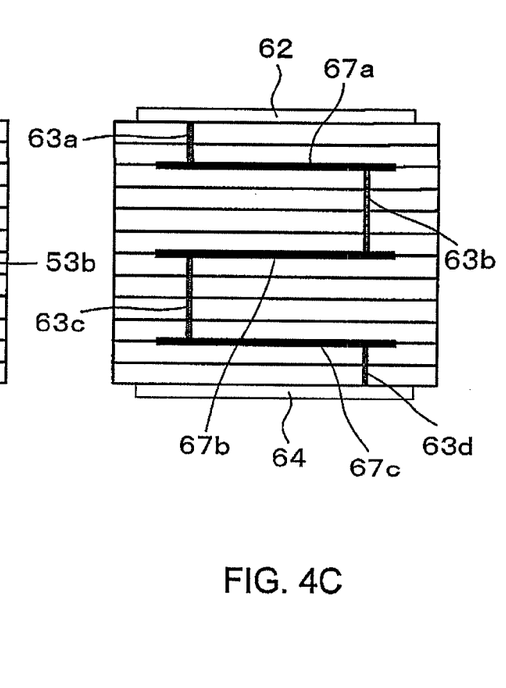

Next, electric strength of the multilayer ceramic substrate with multiple resistive elements serially arranged in a multilayered structure is explained. FIGS. 4A to 4C are sectional drawings illustrating three examples of layered structures of the multilayer ceramic substrate according to the first embodiment of the present invention. The multilayer ceramic substrate shown in FIG. 4A has twelve layers of which the middle layer includes a resistive element 47, where the resistive element 47 is connected to an upper electrode 42 via multiple via-electrodes 43a arranged in parallel and is connected to a lower electrode 44 via multiple via-electrodes 43b similarly arranged in parallel. Moreover, the multilayer ceramic substrate shown in FIG. 4B has a structure in which twelve layers are divided into three equal parts, and resistive elements 57a and 57b are arranged between the fourth layer and the fifth layer and between the eighth layer and the ninth layer, respectively. The resistive element 57a is connected to an upper electrode 52 via multiple via-electrodes 53a arranged in parallel, and the resistive element 57b is connected to a lower electrode 54 via multiple via-electrodes 53c arranged in parallel. Furthermore, it has a structure in which the resistive element 57a is connected to the resistive element 57b via multiple via-electrodes 53b arranged in parallel.

The multilayer ceramic substrate shown in FIG. 4C has a structure of three layers of resistive elements. More specifically, it has a structure in which resistive elements 67a, 67b, and 67c are arranged between the second layer and the third layer from the top, between the sixth layer and the seventh layer, and between the tenth and the eleventh layer, respectively. The upper electrode 62 is connected to the resistive element 67a via multiple via-electrodes 63a arranged in parallel, the resistive element 67a is connected to the resistive element 67b via multiple via-electrodes 63b arranged in parallel, and the resistive element 67b is connected to the resistive element 67c via multiple via-electrodes 63c arranged in parallel. Furthermore, the resistive element 67c is connected to an undersurface electrode 64 via multiple via-electrodes 63d arranged in parallel.

Figure 5:
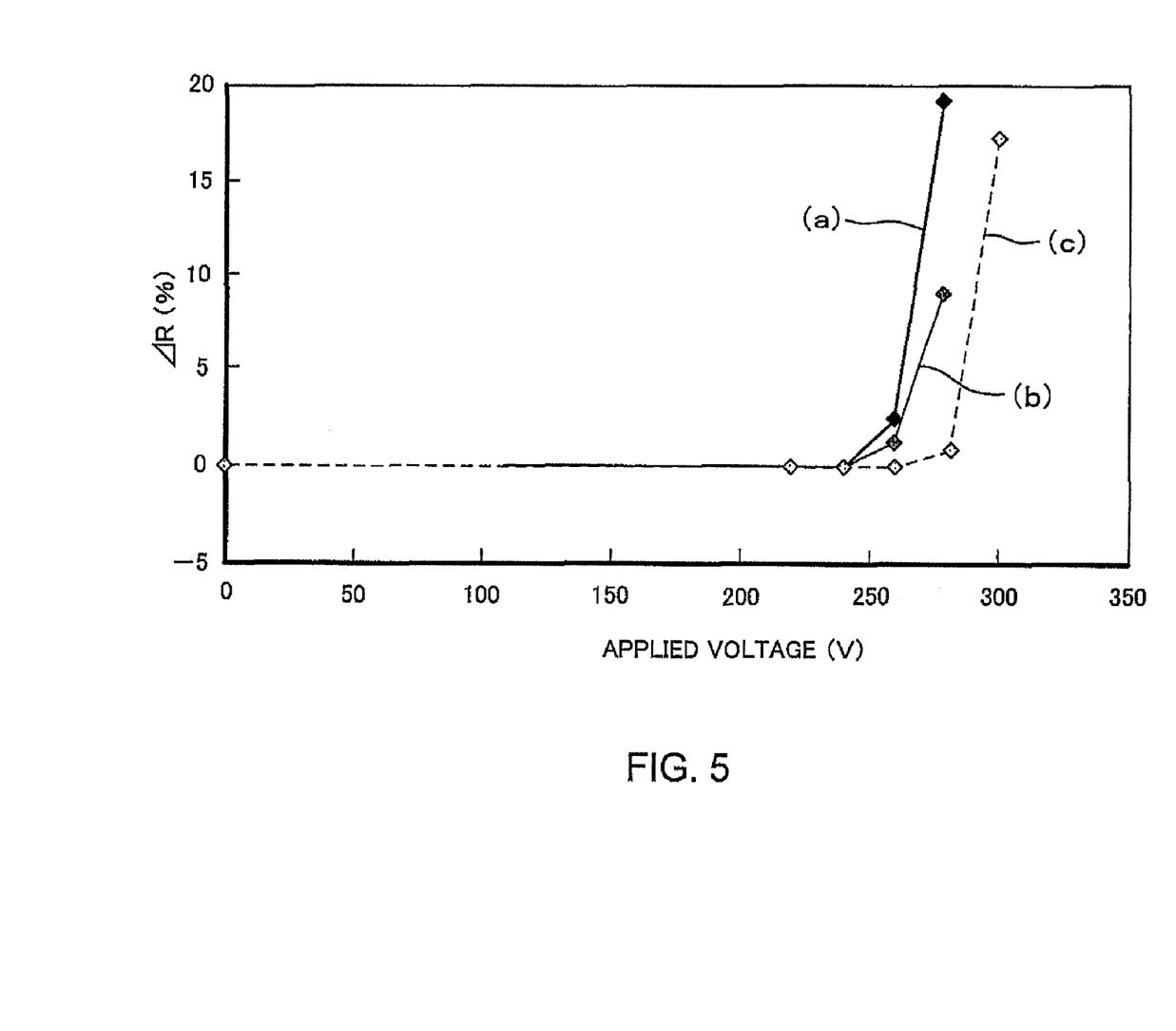
FIG. 5 is a graph showing comparison of measurement results of withstand voltage characteristics of the multilayer ceramic substrate according to the first embodiment.

FIG. 5 shows comparison of measurement results in withstand voltage characteristics of each multilayer ceramic substrate shown in FIGS. 4A to 4C. In FIG. 5, the horizontal axis denotes applied voltage (V) between the upper electrode and the lower electrode of the multilayer ceramic substrate, and the vertical axis denotes change in resistance $\varDelta R(\%)$ at each applied voltage. As shown in FIG. 5, the greater the number of layers of resistive elements arranged in the multilayer ceramic substrate, the smaller the change in resistance. That is, such a multilayer structure lengthens dimension L of the resistive elements, and consequently improves the withstand voltage characteristic of the ceramic multilayer substrate.

Second Embodiment

Figure 6A:
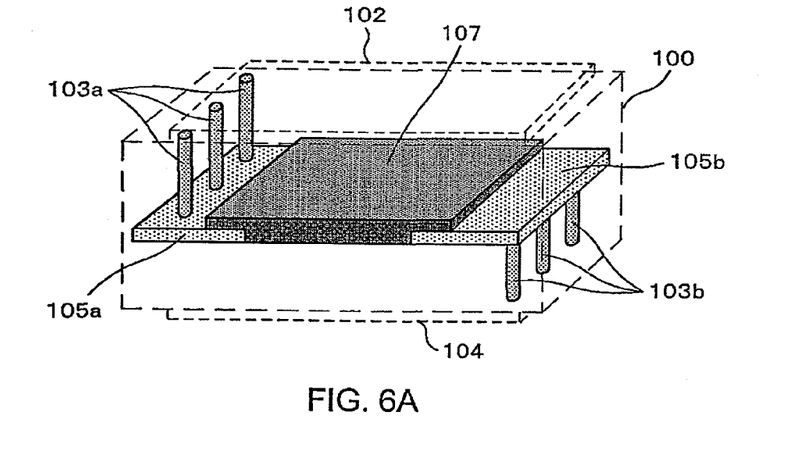
FIGS. 6A and 6B are illustrations of constructional examples of a multilayer ceramic substrate, which is constituted by multiple layers, according to a second embodiment of the present invention.
Figure 6B:
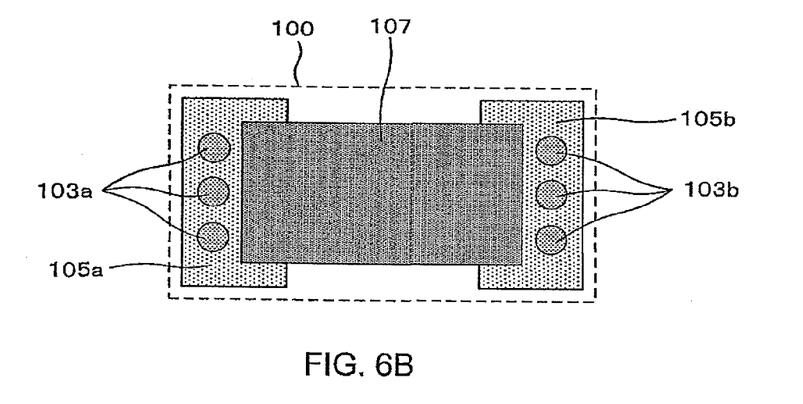

A second embodiment according to the present invention is explained forthwith. FIG. 6A and FIG. 6B show a structure of a multilayer ceramic substrate according to a second embodiment of the present invention, wherein FIG. 6A is a perspective outline showing an internal structure of the multilayer ceramic substrate, and FIG. 6B schematically shows an internal structure of the ceramic multilayer substrate of FIG. 6A when seen from above.

With the multilayer ceramic substrate shown in FIGS. 6A and 6B, pad electrodes 105a and 105b are arranged facing each other on the substrate of a predetermined layer comprising a laminated body of a ceramic multilayer substrate (laminated body) 100, and a resistive element 107 bridges between these pad electrodes 105a and 105b. Multiple (three in the case shown in FIGS. 6A and 6B) via-electrodes 103a and 103b arranged in parallel are arranged on the pad electrodes 105a and 105b. With such a structure, one ends of the respective via-electrodes 103a and 103b are connected to the pad electrodes 105a and 105b, and the other ends of the same are connected to exterior electrodes (upper electrode 102 and lower electrode 104).

As a result, since not only the resistive element 107 is connected to the exterior electrodes 103 and 104 via multiple via-electrodes 103a and 103b arranged in parallel, but also via-electrodes are arranged not covering the resistive element, there is an advantage that restrictions by via-electrodes do not adversely affect arrangement of a resistive element between layers in a multilayer ceramic substrate comprising multiple layers. Furthermore, by arranging multiple via-electrodes in parallel on pad electrodes, which can secure a large area, secure connectivity of resistive elements to exterior electrodes may be provided irrelevant of sectional area of a resistance film as that of the conventional structure.

INDUSTRIAL APPLICABILITY

According to the laminated body and fabrication method thereof of the present invention, highly dense assembly of a laminated body, miniaturization, and space saving are possible. When this is applied to laminated resistors, variation in resistance can be made smaller, and it is applicable to applications for improved connectivity between the internal resistive elements and exterior electrodes. Moreover, in addition to resistors, it is also applicable to multilayer capacitors, inductors etc.

The invention claimed is:

1. A resistor comprising:
    a laminated body made from a plurality of laminated green sheets, said laminated body comprising:
    an internal-layer resistive element formed inside of the laminated body,
    an exterior electrode arranged on an external end surface of the laminated body, and
    a first via-electrode, which allows the internal-layer resistive element to be electrically connected directly to the exterior electrode without penetrating through said internal-layer resistive element, wherein the first via-electrode comprises a plurality of first via-electrodes arranged in parallel on one end of the internal-layer resistive element.

2. The resistor according to claim 1, further comprising a second via-electrode, which allows conduction of a plurality of internal-layer resistive elements arranged in different layers; wherein the second via-electrode comprises a plurality of second via-electrodes arranged in parallel at the ends of the plurality of the internal-layer resistive elements.

3. The resistor according to claim 1, wherein the exterior electrode is arranged on the top surface and the undersurface of the laminated body in a lamination direction, and the plurality of first via-electrodes comprises at least two via-electrodes, which are arranged in parallel and electrically connect one end of the internal-layer resistive element to the exterior electrode arranged on said top surface, and at least two via-electrodes, which are arranged in parallel and electrically connect the other end of the internal-layer resistive element to the exterior electrode arranged on said undersurface.

4. The resistor according to claim 2, wherein the exterior electrode is arranged on the top surface and the undersurface of the laminated body in the lamination direction, the plurality of first via-electrodes, which constitute the first via-electrode, comprise at least two via-electrodes arranged in parallel and electrically connect one end of one of the internal-layer resistive elements to the exterior electrode arranged on said top surface, and at least two via-electrodes arranged in parallel and electrically connect another end of one of the internal-layer resistive elements to the exterior electrode arranged on said undersurface, and
    the plurality of second via-electrodes, which constitute the second via-electrode, comprise at least two via-electrodes arranged in parallel and electrically connect ends of the opposing surfaces of the plurality of internal-layer resistive elements, and provide electrical connection between one ends of the opposing surfaces and between the other ends of the opposing surfaces alternately in the lamination direction, according to the lamination structure of the plurality of internal-layer resistive elements.

* * * * *